United States Patent
Scheffelin et al.

(10) Patent No.: US 6,733,112 B2
(45) Date of Patent: *May 11, 2004

(54) CARRIER FOR PRINTHEAD ASSEMBLY INCLUDING FLUID MANIFOLD AND ISOLATION WELLS FOR ELECTRICAL COMPONENTS

(75) Inventors: Joseph E. Scheffelin, Poway, CA (US); Paul Mark Haines, Lebanon, OR (US)

(73) Assignee: Hewlett-Packard Development Company, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/283,744

(22) Filed: Oct. 30, 2002

(65) Prior Publication Data

US 2003/0048330 A1 Mar. 13, 2003

Related U.S. Application Data

(63) Continuation-in-part of application No. 10/001,180, filed on Nov. 1, 2001, now Pat. No. 6,523,940, which is a continuation of application No. 09/648,120, filed on Aug. 25, 2000, now Pat. No. 6,341,845.

(51) Int. Cl.[7] .................... B41J 2/04; B41J 2/01
(52) U.S. Cl. ............................ 347/54; 347/50
(58) Field of Search .................. 347/54, 50, 40, 347/42, 20, 87

(56) References Cited

U.S. PATENT DOCUMENTS

| | | |
|---|---|---|
| 5,016,023 A | 5/1991 | Chan et al. |
| 5,057,854 A | 10/1991 | Pond et al. |
| 5,079,189 A | 1/1992 | Drake et al. |
| 5,098,503 A | 3/1992 | Drake |
| 5,160,945 A | 11/1992 | Drake |
| 5,469,199 A | 11/1995 | Allen et al. |
| 5,489,930 A | 2/1996 | Anderson |
| 5,565,900 A | 10/1996 | Cowger et al. |
| 5,696,544 A | 12/1997 | Komuro |
| 5,742,305 A | 4/1998 | Hackleman |
| 5,939,206 A | 8/1999 | Kneezel et al. |
| 6,123,410 A | 9/2000 | Beerling et al. |
| 6,250,738 B1 | 6/2001 | Waller et al. |
| 6,322,206 B1 | 11/2001 | Boyd et al. |
| 6,341,845 B1 | 1/2002 | Scheffelin et al. |
| 6,343,857 B1 | 2/2002 | Cowger |
| 6,431,683 B1 | 8/2002 | Ho et al. |
| 6,435,653 B1 | 8/2002 | Boyd et al. |
| 6,523,940 B2 * | 2/2003 | Scheffelin et al. ............ 347/50 |

OTHER PUBLICATIONS

Ross R. Allen, "Inkjet Printing with Large Pagewide Arrays: Issues and Challenges", Recent Progress in Ink Jet Technologies II, pp. 114–120; originally published in " 12th International Congress on Advances in Non–Impact Printing Technologies Proc.", p. 43, 1996.

* cited by examiner

*Primary Examiner*—Michael Nghiem (57) ABSTRACT

A printhead assembly includes a substrate having a first side and a second side opposite the first side, at least one electrical component mounted on the second side of the substrate, a substructure having a fluid manifold and at least one well isolated from the fluid manifold defined therein, and a plurality of printhead dies each mounted on the first side of the substrate. The substructure is disposed on the second side of the substrate such that the at least one electrical component is confined within the at least one well.

33 Claims, 5 Drawing Sheets

CARRIER FOR PRINTHEAD ASSEMBLY INCLUDING FLUID MANIFOLD AND ISOLATION WELLS FOR ELECTRICAL COMPONENTS

CROSS-REFERENCE TO RELATED APPLICATIONS

This application is a Continuation-in-Part of U.S. patent application Ser. No. 10/001,180, now U.S. Pat. No. 6,523,940 filed on Nov. 1, 2001, which is a Continuation of U.S. patent application Ser. No. 09/648,120, filed on Aug. 25, 2000, now U.S. Pat. No. 6,341,845, both assigned to the assignee of the present invention, and incorporated herein by reference.

THE FIELD OF THE INVENTION

The present invention relates generally to inkjet printheads, and more particularly to a carrier including a fluid manifold for an inkjet printhead assembly and isolation wells for electrical components of the inkjet printhead assembly.

BACKGROUND OF THE INVENTION

A conventional inkjet printing system includes a printhead, an ink supply which supplies liquid ink to the printhead, and an electronic controller which controls the printhead. The printhead ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other.

In one arrangement, commonly referred to as a wide-array inkjet printing system, a plurality of individual printheads, also referred to as printhead dies, are mounted on a single carrier. As such, a number of nozzles and, therefore, an overall number of ink drops which can be ejected per second is increased. Since the overall number of ink drops which can be ejected per second is increased, printing speed can be increased with the wide-array inkjet printing system.

When mounting a plurality of printhead dies on a single carrier, the single carrier performs several functions including fluid and electrical routing as well as printhead die support. More specifically, the single carrier accommodates communication of ink between the ink supply and each of the printhead dies, accommodates communication of electrical signals between the electronic controller and each of the printhead dies, and provides a stable support for each of the printhead dies. To accommodate communication of electrical signals between the electronic controller and the printhead dies, the carrier may support one or more electrical components. Unfortunately, fluidic contact with the electrical components can short and/or degrade operability of the electrical components.

Accordingly, it is desirable for a carrier which provides support for a plurality of printhead dies and accommodates fluidic and electrical routing to the printhead dies while providing isolation of electrical components from the fluid.

SUMMARY OF THE INVENTION

A printhead assembly includes a substrate having a first side and a second side opposite the first side, at least one electrical component mounted on the second side of the substrate, a substructure having a fluid manifold and at least one well isolated from the fluid manifold defined therein, and a plurality of printhead dies each mounted on the first side of the substrate. The substructure is disposed on the second side of the substrate such that the at least one electrical component is confined within the at least one well.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
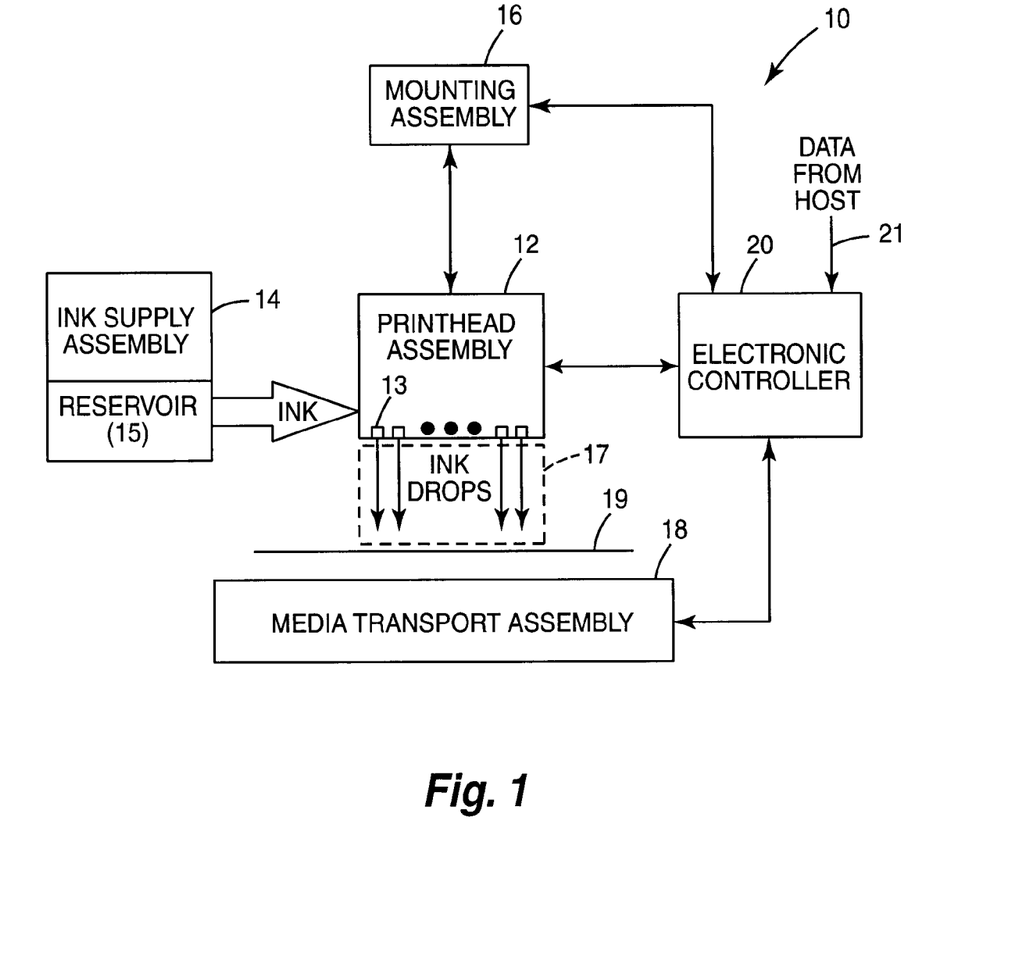
FIG. 1 is a block diagram illustrating one embodiment of an inkjet printing system.

FIG. 1 illustrates one embodiment of an inkjet printing system 10. Inkjet printing system 10 includes an inkjet printhead assembly 12, an ink supply assembly 14, a mounting assembly 16, a media transport assembly 18, and an electronic controller 20. Inkjet printhead assembly 12 is formed according to an embodiment of the present invention, and includes one or more printheads which eject drops of ink or fluid through a plurality of orifices or nozzles 13.

In one embodiment, the drops of ink are directed toward a medium, such as print medium 19, so as to print onto print medium 19. Print medium 19 includes any type of suitable sheet material, such as paper, card stock, transparencies, Mylar, and the like. Typically, nozzles 13 are arranged in one or more columns or arrays such that properly sequenced ejection of ink from nozzles 13 causes, in one embodiment, characters, symbols, and/or other graphics or images to be printed upon print medium 19 as inkjet printhead assembly 12 and print medium 19 are moved relative to each other.

Ink supply assembly 14 supplies ink to inkjet printhead assembly 12 and includes a reservoir 15 for storing ink. As such, in one embodiment, ink flows from reservoir 15 to inkjet printhead assembly 12. In one embodiment, inkjet printhead assembly 12 and ink supply assembly 14 are housed together in an inkjet cartridge or pen. In another embodiment, ink supply assembly 14 is separate from inkjet printhead assembly 12 and supplies ink to inkjet printhead assembly 12 through an interface connection, such as a supply tube.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly and mounting assembly 16 includes a carriage for moving inkjet printhead assembly 12 relative to media transport assembly 18. In another embodiment, inkjet printhead assembly 12 is a non-scanning type printhead assembly and mounting assembly 16 fixes inkjet printhead assembly 12 at a prescribed position relative to media transport assembly 18.

Electronic controller 20 communicates with inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or file to be printed. As such, data 21 forms a print job for inkjet printing system 10 and includes one or more print job commands and/or command parameters.

In one embodiment, electronic controller 20 provides control of inkjet printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops is determined by the print job commands and/or command parameters. In one embodiment, logic and drive circuitry forming a portion of electronic controller 20 is located on inkjet printhead assembly 12. In another embodiment, logic and drive circuitry is located off inkjet printhead assembly 12.

Figure 2:
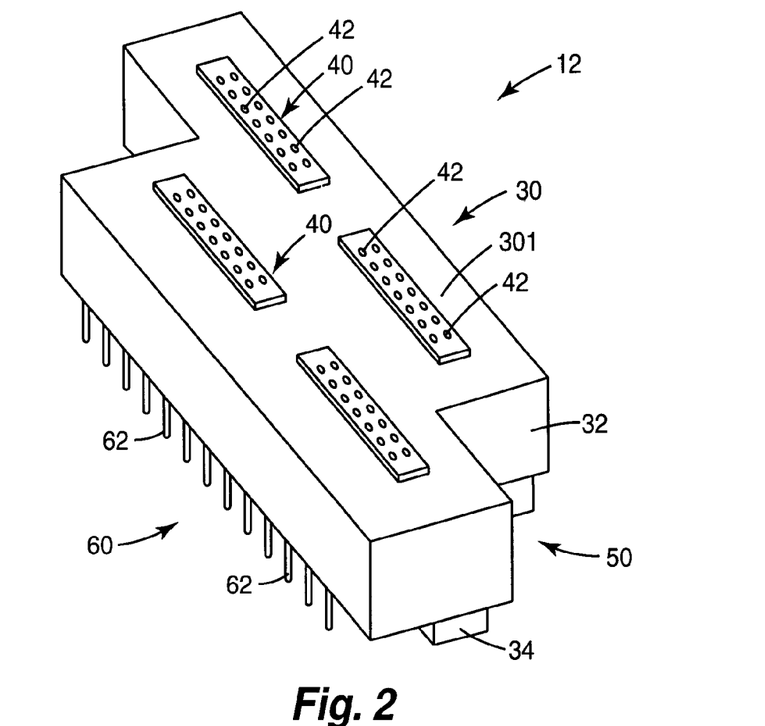
FIG. 2 is a top perspective view illustrating one embodiment of an inkjet printhead assembly.
Figure 3:
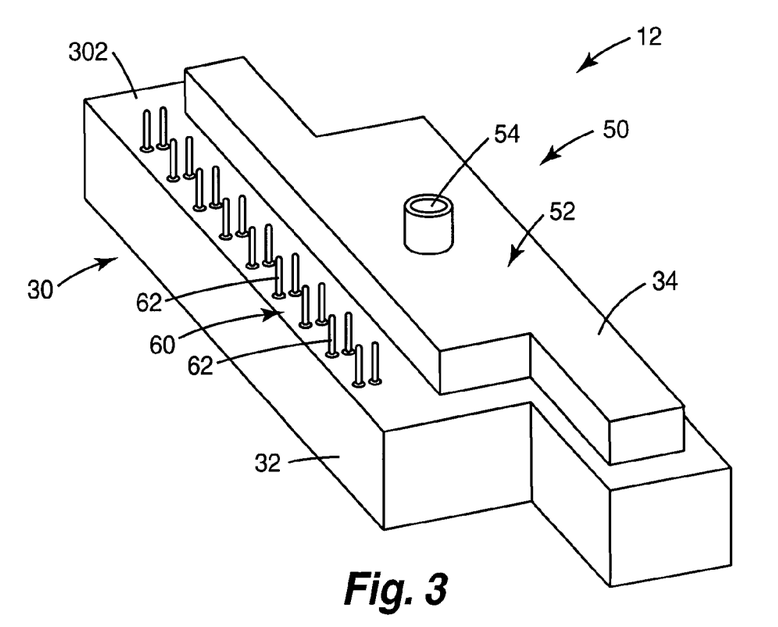
FIG. 3 is a bottom perspective view of the inkjet printhead assembly of FIG. 2.

FIGS. 2 and 3 illustrate one embodiment of a portion of inkjet printhead assembly 12. Inkjet printhead assembly 12 is a wide-array or multi-head printhead assembly and includes a carrier 30, a plurality of printhead dies 40, an ink delivery system 50, and an electronic interface system 60. Carrier 30 has an exposed surface or first face 301 and an exposed surface or second face 302 which is opposite of and oriented substantially parallel with first face 301. Carrier 30 serves to carry or provide mechanical support for printhead dies 40. In addition, carrier 30 accommodates fluidic communication between ink supply assembly 14 and printhead dies 40 via ink delivery system 50 and accommodates electrical communication between electronic controller 20 and printhead dies 40 via electronic interface system 60.

Printhead dies 40 are mounted on first face 301 of carrier 30 and aligned in one or more rows. In one embodiment, printhead dies 40 are spaced apart and staggered such that printhead dies 40 in one row overlap at least one printhead die 40 in another row. Thus, inkjet printhead assembly 12 may span a nominal page width or a width shorter or longer than nominal page width. While four printhead dies 40 are illustrated as being mounted on carrier 30, the number of printhead dies 40 mounted on carrier 30 may vary.

In one embodiment, a plurality of inkjet printhead assemblies 12 are mounted in an end-to-end manner. In one embodiment, to provide for at least one printhead die 40 of one inkjet printhead assembly 12 overlapping at least one printhead die 40 of an adjacent inkjet printhead assembly 12, carrier 30 has a staggered or stair-step profile. While carrier 30 is illustrated as having a stair-step profile, it is within the scope of the present invention for carrier 30 to have other profiles including a substantially rectangular profile.

Ink delivery system 50 fluidically couples ink supply assembly 14 with printhead dies 40. In one embodiment, ink delivery system 50 includes a fluid manifold 52 and a port 54. Fluid manifold 52 is formed in carrier 30 and distributes ink through carrier 30 to each printhead die 40. Port 54 communicates with fluid manifold 52 and provides an inlet for ink supplied by ink supply assembly 14.

Electronic interface system 60 electrically couples electronic controller 20 with printhead dies 40. In one embodiment, electronic interface system 60 includes a plurality of electrical contacts 62 which form input/output (I/O) contacts for electronic interface system 60. As such, electrical contacts 62 provide points for communicating electrical signals between electronic controller 20 and inkjet printhead assembly 12. Examples of electrical contacts 62 include I/O pins which engage corresponding I/O receptacles electrically coupled to electronic controller 20 and I/O contact pads or fingers which mechanically or inductively contact corresponding electrical nodes electrically coupled to electronic controller 20. Although electrical contacts 62 are illustrated as being provided on second face 302 of carrier 30, it is within the scope of the present invention for electrical contacts 62 to be provided on other sides of carrier 30.

Figure 4:
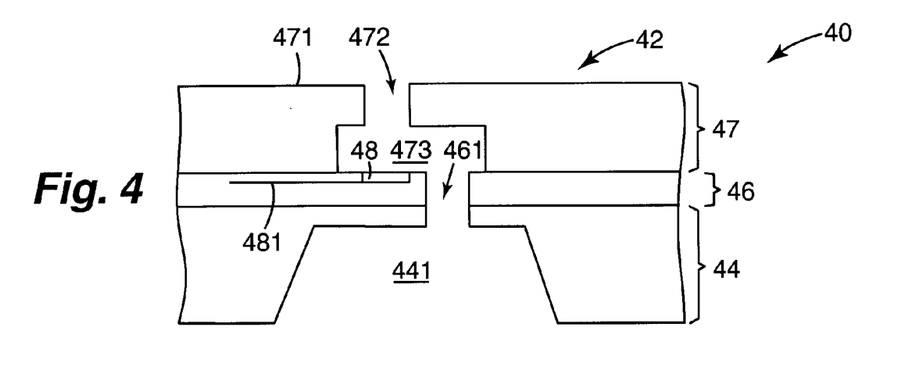
FIG. 4 is a schematic cross-sectional view illustrating portions of one embodiment of a printhead die.

As illustrated in the embodiment of FIGS. 2 and 4, each printhead die 40 includes an array of drop ejecting elements 42. Drop ejecting elements 42 are formed on a substrate 44 which has an ink or fluid feed slot 441 formed therein. As such, fluid feed slot 441 provides a supply of ink or fluid to drop ejecting elements 42. Substrate 44 is formed, for example, of silicon, glass, or a stable polymer.

In one embodiment, each drop ejecting element 42 includes a thin-film structure 46 and an orifice layer 47. Thin-film structure 46 includes a firing resistor 48 and has an ink or fluid feed channel 461 formed therein which communicates with fluid feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and fluid feed channel 461 of thin-film structure 46. Firing resistor 48 is positioned within nozzle chamber 473 and includes leads 481 which electrically couple firing resistor 48 to a drive signal and ground.

Thin-film structure 46 is formed, for example, by one or more passivation or insulation layers of silicon dioxide, silicon carbide, silicon nitride, tantalum, poly-silicon glass, or other suitable material. In one embodiment, thin-film structure 46 also includes a conductive layer which defines firing resistor 48 and leads 481. The conductive layer is formed, for example, by aluminum, gold, tantalum, tantalum-aluminum, or other metal or metal alloy.

In one embodiment, during operation, ink or fluid flows from fluid feed slot 441 to nozzle chamber 473 via fluid feed channel 461. Nozzle opening 472 is operatively associated with firing resistor 48 such that droplets of ink or fluid are ejected from nozzle chamber 473 through nozzle opening 472 (e.g., normal to the plane of firing resistor 48) and toward a medium upon energization of firing resistor 48.

Example embodiments of printhead dies 40 include a thermal printhead, as described above, a piezoelectric printhead, a flex-tensional printhead, or any other type of fluid ejection device known in the art. In one embodiment, printhead dies 40 are fully integrated thermal inkjet printheads.

Figure 5:
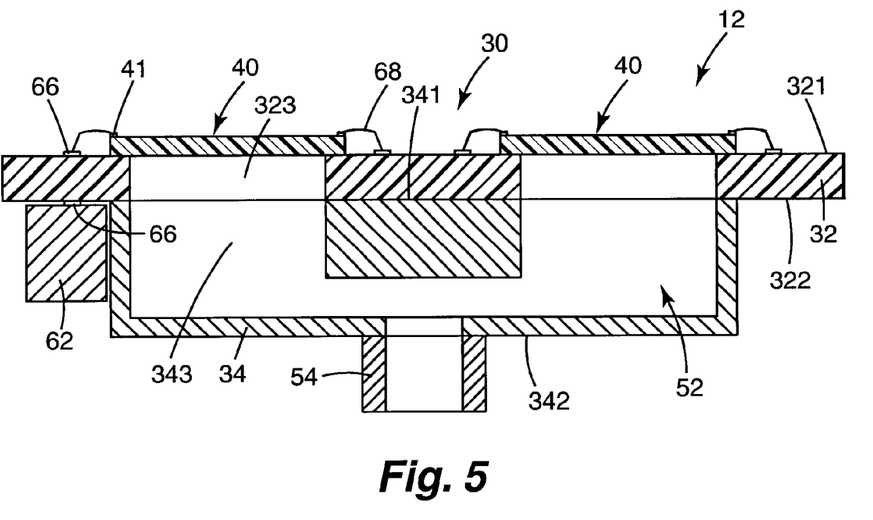
FIG. 5 is a schematic cross-sectional view illustrating one embodiment of an inkjet printhead assembly.

Referring to the embodiment of FIGS. 2, 3, and 5, carrier 30 includes a substrate 32 and a substructure 34. Substrate 32 and substructure 34 provide and/or accommodate mechanical, electrical, and fluidic functions of inkjet printhead assembly 12. More specifically, substrate 32 provides mechanical support for printhead dies 40, accommodates fluidic communication between ink supply assembly 14 and printhead dies 40 via ink delivery system 50, and provides electrical connection between and among printhead dies 40 and electronic controller 20 via electronic interface system 60. Substructure 34 provides mechanical support for substrate 32, accommodates fluidic communication between ink supply assembly 14 and printhead dies 40 via ink delivery system 50, and accommodates electrical connection between printhead dies 40 and electronic controller 20 via electronic interface system 60.

Substrate 32 has a first side 321 and a second side 322 which is opposite first side 321, and substructure 34 has a first side 341 and a second side 342 which is opposite first side 341. In one embodiment, printhead dies 40 are mounted on first side 321 of substrate 32 and substructure 34 is disposed on second side 322 of substrate 32. As such, first side 341 of substructure 34 contacts and is joined to second side 322 of substrate 32.

For transferring ink between ink supply assembly 14 and printhead dies 40, substrate 32 and substructure 34 each have a plurality of ink or fluid passages 323 and 343, respectively, formed therein. Fluid passages 323 extend through substrate 32 and provide a through-channel or through-opening for delivery of ink to printhead dies 40 and, more specifically, fluid feed slot 441 of substrate 44 (FIG. 4). Fluid passages 343 extend through substructure 34 and provide a through-channel or through-opening for delivery of ink to fluid passages 323 of substrate 32. As such, fluid passages 323 and 343 form a portion of ink delivery system 50. Although only one fluid passage 323 is shown for a given printhead die 40, there may be additional fluid passages to the same printhead die, for example, to provide ink of respective differing colors.

In one embodiment, substructure 34 is formed of a non-ceramic material such as plastic. Substructure 34 is formed, for example, of a high performance plastic including a fiber reinforced resin such as polyphenylene sulfide (PPS) or a polystyrene (PS) modified polyphenylene oxide (PPO) or polyphenylene ether (PPE) blend such as NORYL®. It is, however, within the scope of the present invention for substructure 34 to be formed of silicon, stainless steel, or other suitable material or combination of materials. Preferably, substructure 34 is chemically compatible with liquid ink so as to accommodate fluidic routing.

Figure 6:
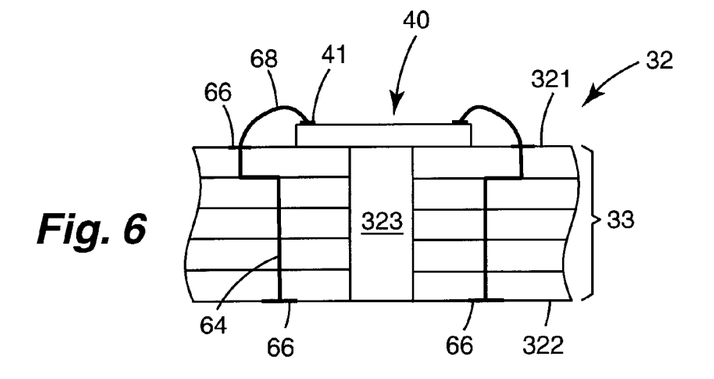
FIG. 6 is a schematic cross-sectional view illustrating one embodiment of a portion of a substrate for an inkjet printhead assembly.

For transferring electrical signals between electronic controller 20 and printhead dies 40, electronic interface system 60 includes a plurality of conductive paths 64 extending through substrate 32, as illustrated in FIG. 6. More specifically, substrate 32 includes conductive paths 64 which pass through and terminate at exposed surfaces of substrate 32. In one embodiment, conductive paths 64 include electrical contact pads 66 at terminal ends thereof which form, for example, I/O bond pads on substrate 32. Conductive paths 64, therefore, terminate at and provide electrical coupling between electrical contact pads 66.

Electrical contact pads 66 provide points for electrical connection to substrate 32 and, more specifically, conductive paths 64. Electrical connection is established, for example, via electrical connectors or contacts 62, such as I/O pins or spring fingers, wire bonds, electrical nodes, and/or other suitable electrical connectors. In one embodiment, printhead dies 40 include electrical contacts 41 which form I/O bond pads. As such, electronic interface system 60 includes electrical connectors, for example, wire bond leads 68, which electrically couple electrical contact pads 66 with electrical contacts 41 of printhead dies 40.

Conductive paths 64 transfer electrical signals between electronic controller 20 and printhead dies 40. More specifically, conductive paths 64 define transfer paths for power, ground, and data among and/or between printhead dies 40 and electrical controller 20. In one embodiment, data includes print data and non-print data.

In one embodiment, as illustrated in FIG. 6, substrate 32 includes a plurality of layers 33 each formed of a ceramic material. As such, substrate 32 includes circuit patterns which pierce layers 33 to form conductive paths 64. In one fabrication methodology, circuit patterns are formed in layers of unfired tape (referred to as green sheet layers) using a screen printing process. The green sheet layers are made of ceramic particles in a polymer binder. Alumina may be used for the particles, although other oxides or various glass/ceramic blends may be used. Each green sheet layer receives conductor lines and other metallization patterns as needed to form conductive paths 64. Such lines and patterns are formed with a refractory metal, such as tungsten, by screen printing on the corresponding green sheet layer. Thereafter, the green sheet layers are fired. Thus, conductive and non-conductive or insulative layers are formed in substrate 32. While substrate 32 is illustrated as including layers 33, it is, however, within the scope of the present invention for substrate 32 to be formed of a solid pressed ceramic material. As such, conductive paths are formed, for example, as thin-film metallized layers on the pressed ceramic material.

While conductive paths 64 are illustrated as terminating at first side 321 and second side 322 of substrate 32, it is, however, within the scope of the present invention for conductive paths 64 to terminate at other sides of substrate 32. In addition, one or more conductive paths 64 may branch from and/or lead to one or more other conductive paths 64. Furthermore, one or more conductive paths 64 may begin and/or end within substrate 32. Conductive paths 64 may be formed as described, for example, in U.S. Pat. No. 6,428,145, entitled "Wide-Array Inkjet Printhead Assembly with Internal Electrical Routing System" assigned to the assignee of the present invention.

It is to be understood that FIGS. 5 and 6 are simplified schematic illustrations of one embodiment of carrier 30, including substrate 32 and substructure 34. The illustrative routing of fluid passages 323 and 343 through substrate 32 and substructure 34, respectively, and conductive paths 64 through substrate 32, for example, has been simplified for clarity of the invention. Although various features of carrier 30, such as fluid passages 323 and 343 and conductive paths 64, are schematically illustrated as being straight, it is understood that design constraints could make the actual geometry more complicated for a commercial embodiment of inkjet printhead assembly 12. Fluid passages 323 and 343, for example, may have more complicated geometries to allow multiple colorants of ink to be channeled through carrier 30. In addition, conductive paths 64 may have more complicated routing geometries through substrate 32 to avoid contact with fluid passages 323 and to allow for electrical connector geometries other than the illustrated I/O pins. It is understood that such alternatives are within the scope of the present invention.

Figure 7:
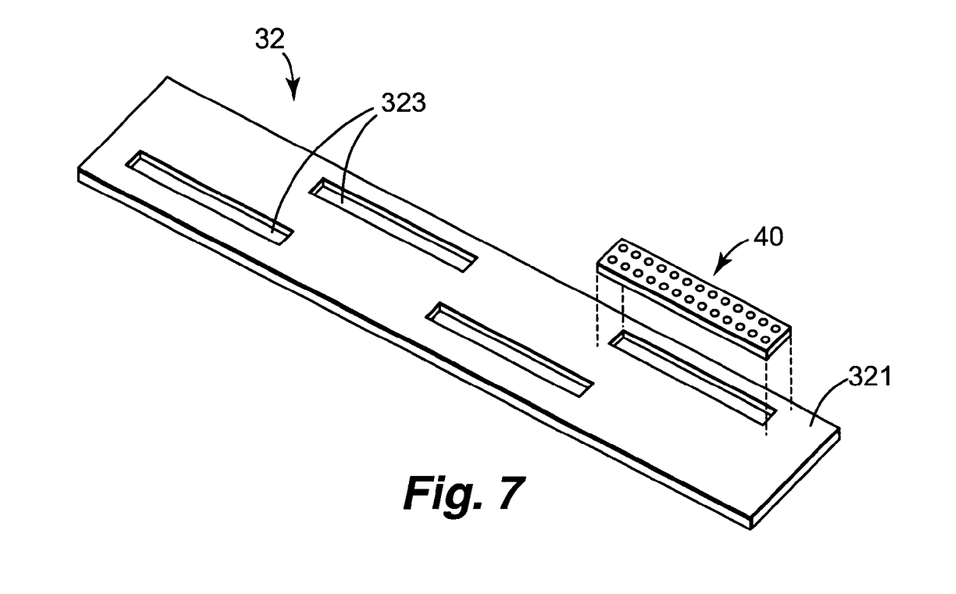
FIG. 7 is a top perspective view illustrating one embodiment of a substrate for an inkjet printhead assembly.
Figure 8:
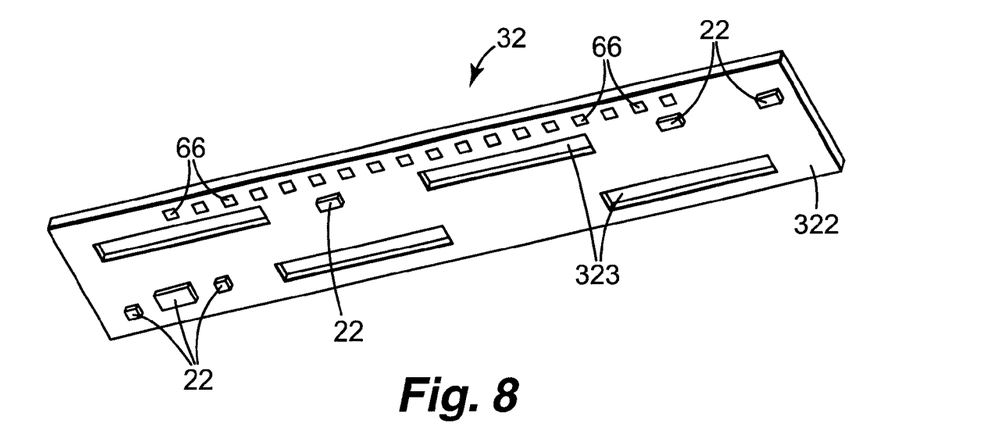
FIG. 8 is a bottom perspective view of the substrate of FIG. 7.

FIGS. 7 and 8 illustrate one embodiment of substrate 32. As described above, substrate 32 includes a plurality of fluid passages 323. Printhead dies 40 are mounted on first side 321 of substrate 32 such that each printhead die 40 communicates with one fluid passage 323. As such, substrate 32 provides support for and accommodates fluidic routing to printhead dies 40.

As illustrated in the embodiment of FIG. 8, electrical contact pads 66 are provided on second side 322 of substrate 32. Electrical contact pads 66 provide points for electrical connection of electrical connectors or contacts 62 (FIG. 3) to substrate 32 and, more specifically, conductive paths 64 (FIG. 6), as described above. Accordingly, substrate 32 provides electrical routing or connection between and/or among printhead dies 40 and electronic controller 20.

In one embodiment, as illustrated in FIG. 8, electronic controller 20 of inkjet printhead assembly 12 includes one or more electrical components 22. Electrical components 22 may provide logic and/or drive circuitry for inkjet printhead assembly 12 including, more specifically, printhead dies 40 and may perform other functions such as testing and/or measurement or monitoring of inkjet printhead assembly 12. Electrical components 22 include, for example, capacitors, thermistors, integrated circuits, such as an acumen chip, and/or other electrical components. In one embodiment, electrical components 22 are mounted on second side 322 of substrate 32. In addition, electrical components 22 are electrically coupled to conductive paths 64 (FIG. 6) formed in substrate 32. As such, electrical components 22 communicate with electronic controller 20 and/or printhead dies 40.

Figure 9:
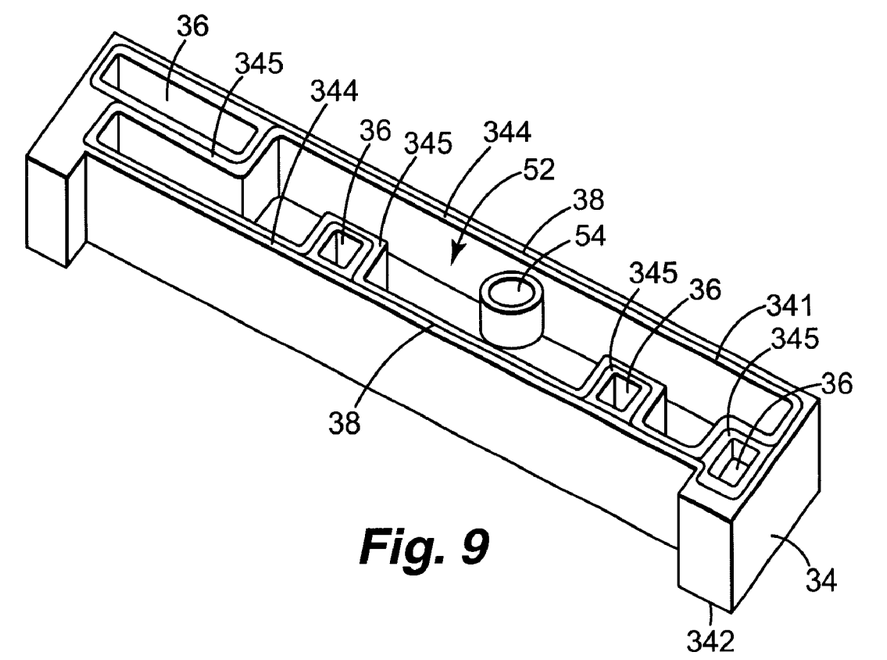
FIG. 9 is a top perspective view illustrating one embodiment of a substructure for an inkjet printhead assembly including one embodiment of a fluid manifold and isolation wells.

As illustrated in the embodiment of FIG. 9, fluid manifold 52 of ink delivery system 50 is formed in substructure 34 of carrier 30. In addition, fluid port 54 is formed in substructure 34 so as to communicate with fluid manifold 52. In one embodiment, fluid manifold 52 is formed so as to communicate with first side 341 of substructure 34 and fluid port 54 is formed so as to communicate with second side 342 of substructure 34.

In one embodiment, as illustrated in FIG. 9, substructure 34 includes one or more wells 36. Wells 36 include cavities or regions of substructure 34 which are isolated from fluid manifold 52. As such, fluid distributed through fluid manifold 52 does not enter or communicate with wells 36. In addition, wells 36 are open to or communicate with first side 341 of substructure 34.

In one embodiment, fluid manifold 52 is defined by a perimeter wall 344 of substructure 34. In addition, wells 36 are defined by portions of perimeter wall 344 and respective inner walls 345 of substructure 34 which protrude from perimeter wall 344. As such, wells 36 are isolated from fluid manifold 52 by respective inner walls 345.

Figure 10:
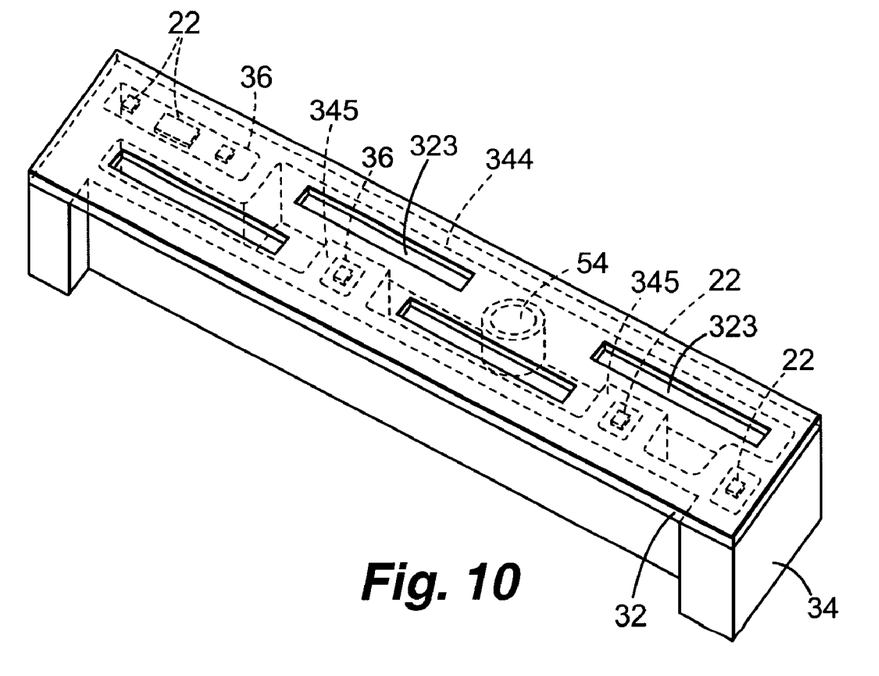
FIG. 10 is a top perspective view illustrating the substrate of FIGS. 7 and 8 supported by the substructure of FIG. 9.

As illustrated in the embodiment of FIG. 10, substructure 34 supports substrate 32 such that fluid from fluid port 54 is distributed to fluid passages 323 and printhead dies 40 through fluid manifold 52. In addition, substructure 34 supports substrate 32 such that electrical components 22 mounted on second side 322 of substrate 32 are confined within respective wells 36 of substructure 34. As such, portions of perimeter wall 344 and respective inner walls 345 of substructure 34 surround one or more electrical components 22. Thus, electrical components 22 are isolated from fluid manifold 52 and, more specifically, fluid distributed through fluid manifold 52. In one embodiment, electrical components 22 are encapsulated to provide additional protection.

Substrate 32 is mounted on substructure 34 such that perimeter wall 344 and inner walls 345 of substructure 34 support substrate 32. In one embodiment, an adhesive 38 (FIG. 9) is interposed between substructure 34 and substrate 32 to form a fluidic seal between first side 341 of substructure 34 and second side 322 of substrate 32 including, more specifically, between fluid manifold 52 and wells 36. The fluidic seal is formed, for example, by forming a continuous bead of adhesive 38 on first side 341 of substructure 34 along perimeter wall 344 and inner walls 345 of substructure 34. Thus, when substrate 32 is mounted on substructure 34 wells 36 are fluidically isolated from fluid manifold 52 by the seal formed by adhesive 38. In one embodiment, wells 36 are vented externally of substructure 34 to facilitate venting of wells 36 as well as access to electrical components 22.

By mounting electrical components 22 on second side 322 of substrate 32, electrical components 22 do not interfere with the design and/or layout of printhead dies 40 on first side 321. In addition, by mounting electrical components 22 directly on substrate 32, rather than another component mounting device, additional electrical connections and/or complexity of inkjet printhead assembly 12 is avoided. Furthermore, by isolating wells 36 from fluid manifold 52 and mounting substrate 32 on substructure 34 such that electrical components 22 are confined within wells 36, electrical components 22 are protected from fluidic contact which could short and/or degrade operability of electrical components 22 when fluid is distributed through manifold 52.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A printhead assembly, comprising:
   a substrate having a first side and a second side opposite the first side;
   at least one electrical component mounted on the second side of the substrate;
   a substructure having a fluid manifold and at least one well isolated from the fluid manifold defined therein, the substructure disposed on the second side of the substrate and the at least one electrical component confined within the at least one well; and a plurality of printhead dies each mounted on the first side of the substrate.

2. The printhead assembly of claim 1, wherein the at least one well is fluidically isolated from the fluid manifold.

3. The printhead assembly of claim 1, wherein the substructure has a first side and a second side opposite the first side, and wherein the fluid manifold and the at least one well communicate with the first side of the substructure.

4. The printhead assembly of claim 3, further comprising:

a fluidic seal formed between the first side of the substructure and the second side of the substrate.

5. The printhead assembly of claim 4, wherein the fluidic seal includes an adhesive interposed between the first side of the substructure and the second side of the substrate.

6. The printhead assembly of claim 1, wherein the substructure includes a perimeter wall defining the fluid manifold and at least one inner wall protruding from the perimeter wall, wherein a portion of the perimeter wall and the at least one inner wall define the at least one well.

7. The printhead assembly of claim 6, wherein the portion of the perimeter wall and the at least one inner wall surround the at least one electrical component.

8. The printhead assembly of claim 6, wherein the perimeter wall and the at least one inner wall support the substrate.

9. The printhead assembly of claim 1, wherein the substrate has an electrical circuit formed therein, wherein the at least one electrical component and each of the printhead dies are electrically coupled to the electrical circuit.

10. The printhead assembly of claim 1, wherein the substrate has a plurality of fluid passages defined therein, wherein the fluid manifold communicates with each of the fluid passages and each of the printhead dies communicate with at least one of the fluid passages.

11. The printhead assembly of claim 1, wherein the substructure includes a fluid port communicating with the fluid manifold.

12. A method of forming a printhead assembly, the method comprising:

providing a substrate having a first side and a second side opposite the first side;

mounting at least one electrical component on the second side of the substrate;

defining a fluid manifold and at least one well in a substructure, including isolating the at least one well from the fluid manifold;

disposing the substructure on the second side of the substrate, including confining the at least one electrical component within the at least one well; and mounting a plurality of printhead dies on the first side of the substrate.

13. The method of claim 12, wherein isolating the at least one well from the fluid manifold includes fluidically isolating the at least one well from the fluid manifold.

14. The method of claim 12, wherein the substructure has a first side and a second side opposite the first side, wherein defining the fluid manifold and the at least one well in the substructure includes communicating the fluid manifold and the at least one well with the first side of the substructure.

15. The method of claim 14, wherein disposing the substructure on the substrate includes forming a fluidic seal between the first side of the substructure and the second side of the substrate.

16. The method of claim 15, wherein forming the fluidic seal between the substructure and the substrate includes interposing an adhesive between the first side of the substructure and the second side of the substrate.

17. The method of claim 12, wherein defining the fluid manifold in the substructure includes forming a perimeter wall of the substructure, and wherein defining the at least one well in the substructure includes protruding at least one inner wall from the perimeter wall and defining the at least one well by a portion of the perimeter wall and the at least one inner wall.

18. The method of claim 17, wherein confining the at least one electrical component within the at least one well includes surrounding the at least one electrical component with the portion of the perimeter wall and the at least one inner wall.

19. The method of claim 17, wherein disposing the substructure on the substrate includes supporting the substrate with the perimeter wall and the at least one inner wall.

20. The method of claim 12, wherein the substrate has an electrical circuit formed therein, wherein mounting the at least one electrical component and the printhead dies on the substrate includes electrically coupling the at least one electrical component and each of the printhead dies with the electrical circuit.

21. The method of claim 12, wherein the substrate has a plurality of fluid passages defined therein, wherein disposing the substructure on the substrate includes communicating the fluid manifold with each of the fluid passages and mounting the printhead dies on the substrate includes communicating each of the printhead dies with at least one of the fluid passages.

22. The method of claim 12, further comprising:

forming a fluid port in the substructure, including communicating the fluid port with the fluid manifold.

23. A carrier adapted to receive a plurality of printhead dies, the carrier comprising:

a substrate having a first side and a second side opposite the first side, the first side adapted to support the printhead dies and the second side adapted to support at least one electrical component; and a substructure having a fluid manifold and at least one well isolated from the fluid manifold defined therein, wherein the substructure is adapted to support the substrate and the at least one well is adapted to confine the at least one electrical component.

24. The carrier of claim 23, wherein the at least one well is fluidically isolated from the fluid manifold.

25. The carrier of claim 23, wherein the substructure has a first side and a second side opposite the first side, and wherein the fluid manifold and the at least one well communicate with the first side of the substructure.

26. The carrier of claim 25, wherein the first side of the substructure and the second side of the substrate are adapted to form a fluidic seal.

27. The carrier of claim 26, wherein the fluidic seal includes an adhesive interposed between the first side of the substructure and the second side of the substrate.

28. The carrier of claim 23, wherein the substructure includes a perimeter wall defining the fluid manifold and at least one inner wall protruding from the perimeter wall, wherein a portion of the perimeter wall and the at least one inner wall define the at least one well.

29. The carrier of claim 28, wherein the portion of the perimeter wall and the at least one inner wall are adapted to surround the at least one electrical component.

30. The carrier of claim 28, wherein the perimeter wall and the at least one inner wall are adapted to support the substrate.

31. The carrier of claim 23, wherein the substrate has an electrical circuit formed therein, wherein the at least one electrical component and each of the printhead dies are adapted to be electrically coupled with the electrical circuit.

32. The carrier of claim 23, wherein the substrate has a plurality of fluid passages defined therein, wherein the fluid manifold is adapted to communicate with each of the fluid passages and each of the printhead dies are adapted to communicate with at least one of the fluid passages.

33. The carrier of claim 23, wherein the substructure includes a fluid port communicating with the fluid manifold.

* * * * *